United States Patent
Shieh et al.

(10) Patent No.: US 11,469,860 B2
(45) Date of Patent: Oct. 11, 2022

(54) METHOD AND APPARATUS FOR REDUCING AMOUNT OF MEMORY REQUIRED BY HYBRID AUTOMATIC REPEAT REQUEST (HARQ) OPERATIONS

(71) Applicant: HON LIN TECHNOLOGY CO., LTD., Taipei (TW)

(72) Inventors: Shin-Lin Shieh, New Taipei (TW); Tai-Hsun Chen, New Taipei (TW)

(73) Assignee: HON LIN TECHNOLOGY CO., LTD., Taipei (TW)

( * ) Notice: Subject to any disclaimer, the term of this patent is extended or adjusted under 35 U.S.C. 154(b) by 68 days.

(21) Appl. No.: 17/213,822

(22) Filed: Mar. 26, 2021

(65) Prior Publication Data

US 2021/0409164 A1    Dec. 30, 2021

Related U.S. Application Data

(60) Provisional application No. 63/045,939, filed on Jun. 30, 2020.

(51) Int. Cl.
*H04L 1/00* (2006.01)
*H04L 1/18* (2006.01)
*H03M 13/11* (2006.01)
*H03M 13/25* (2006.01)

(52) U.S. Cl.
CPC ....... *H04L 1/1819* (2013.01); *H03M 13/1114* (2013.01); *H03M 13/255* (2013.01); *H04L 1/0029* (2013.01); *H04L 1/0057* (2013.01); *H04L 1/0061* (2013.01)

(58) Field of Classification Search
None
See application file for complete search history.

(56) References Cited

U.S. PATENT DOCUMENTS

| | | | |
|---|---|---|---|
| 2010/0157901 A1* | 6/2010 | Sanderovitz | H04B 7/022 370/328 |
| 2014/0192857 A1 | 7/2014 | Perets et al. | |
| 2015/0109996 A1 | 4/2015 | Lee et al. | |
| 2017/0207884 A1 | 7/2017 | Jiang et al. | |
| 2019/0159238 A1* | 5/2019 | Kim | H04L 1/1812 |
| 2020/0067528 A1* | 2/2020 | Arikan | H03M 13/13 |
| 2021/0099251 A1* | 4/2021 | Podlozhnyuk | H03M 13/1137 |

FOREIGN PATENT DOCUMENTS

| | | |
|---|---|---|
| EP | 2685656 A1 | 1/2014 |
| WO | 2010023149 A1 | 3/2010 |
| WO | 2012012248 A1 | 1/2012 |

* cited by examiner

*Primary Examiner* — Mujtaba M Chaudry
(74) *Attorney, Agent, or Firm* — ScienBiziP, P.C.

(57) ABSTRACT

A method reducing amount of memory utilized by hybrid automatic repeat request (HARQ) operations is disclosed. When an apparatus employing the method receives an LDPC encoded packet, the apparatus firstly estimates a signal quality value of the received packet, and performs an LDPC decoding algorithm on the received packet. If the received packet is not successfully decoded by the apparatus, the received and decoding-failed packet is compressed in order to reduce bit-width, and the compressed packet is stored in a memory device for later HARQ operations. The apparatus employing the method is also disclosed.

16 Claims, 4 Drawing Sheets

METHOD AND APPARATUS FOR REDUCING AMOUNT OF MEMORY REQUIRED BY HYBRID AUTOMATIC REPEAT REQUEST (HARQ) OPERATIONS

FIELD

The subject matter herein generally relates to wireless communications, and more particularly, to a method for reducing the amount of memory used by HARQ operations, and an apparatus thereof.

BACKGROUND

Wireless communication systems rely on HARQ technology to provide robust error control for varying channel characteristics. When a first-transmitted packet cannot be successfully decoded, HARQ technology buffers the failed decoding packet from future combining with later re-transmitted packets. However, high performance HARQ operations require memory space for storage of received packets, which is expensive in terms of chip areas.

To handle massive growth in traffic volume caused by 5G wireless communications, solutions are needed for reducing memory size used by HARQ operations.

BRIEF DESCRIPTION OF THE DRAWINGS

Implementations of the present technology will now be described, by way of embodiment, with reference to the attached figures, wherein.

DETAILED DESCRIPTION

Figure 1:
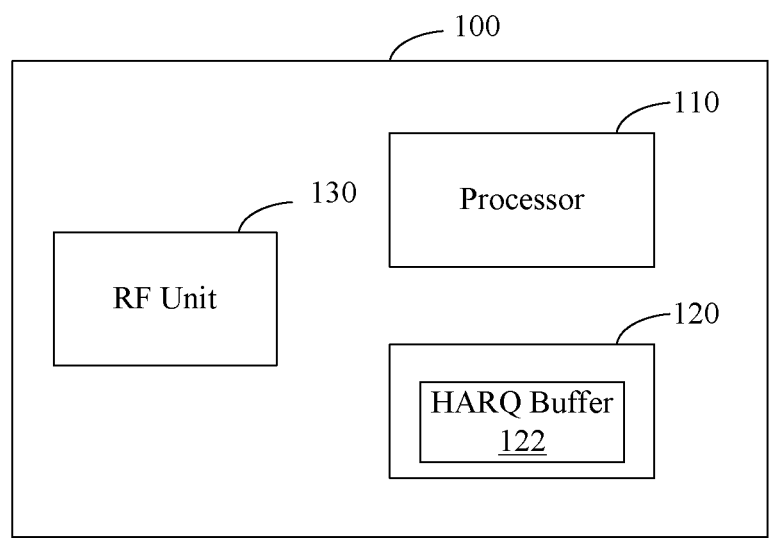
FIG. 1 is a block diagram of one embodiment of an apparatus for reducing amount of memory used by hybrid automatic repeat request (HARQ) operations.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

References to "an" or "one" embodiment in this disclosure are not necessarily to the same embodiment, and such references mean "at least one".

In general, the word "module" as used hereinafter, refers to logic embodied in computing or firmware, or to a collection of software instructions, written in a programming language, such as, Java, C, or assembly. One or more software instructions in the modules may be embedded in firmware, such as in an erasable programmable read only memory (EPROM). The modules described herein may be implemented as either software and/or computing modules and may be stored in any type of non-transitory computer-readable medium or other storage device. Some non-limiting examples of non-transitory computer-readable media include CDs, DVDs, BLU-RAY, flash memory, and hard disk drives. The term "comprising", when utilized, means "including, but not necessarily limited to"; it specifically indicates open-ended inclusion or membership in a so-described combination, group, series, and the like.

FIG. 1 illustrates an apparatus 100 for reducing amount of memory utilized by HARQ operations. The apparatus 100 comprises a processor 110, a memory 120, and a radio frequency (RF) unit 130. The processor 110 comprises a microcontroller, a microprocessor, a complex instruction set arithmetic microprocessor, a reduced instruction set arithmetic microprocessor, an ultra-long instruction set microprocessor, an ultra-parallel instruction set arithmetic microprocessor, and a digital signal processor or other circuit with computational processing capabilities. The processor 110 implements the method disclosed. The memory 120 comprises a read-only memory (ROM), a random access memory (RAM), a magnetic storage medium device, an optical storage medium device, a flash memory device, an electrical, optical, or other computer-readable storage medium device which is physical/tangible and is non-transitory. The memory 120 further comprises a HARQ buffer 122 to temporarily store decoding-failed packets. The memory 120 is coupled with the processor 110 to store one or more computer programs that control the operation of the apparatus 100, and are executed by the processor 110. The RF unit 130 is coupled with the processor 110 to transmit and/or receive radio signals.

Figure 2:
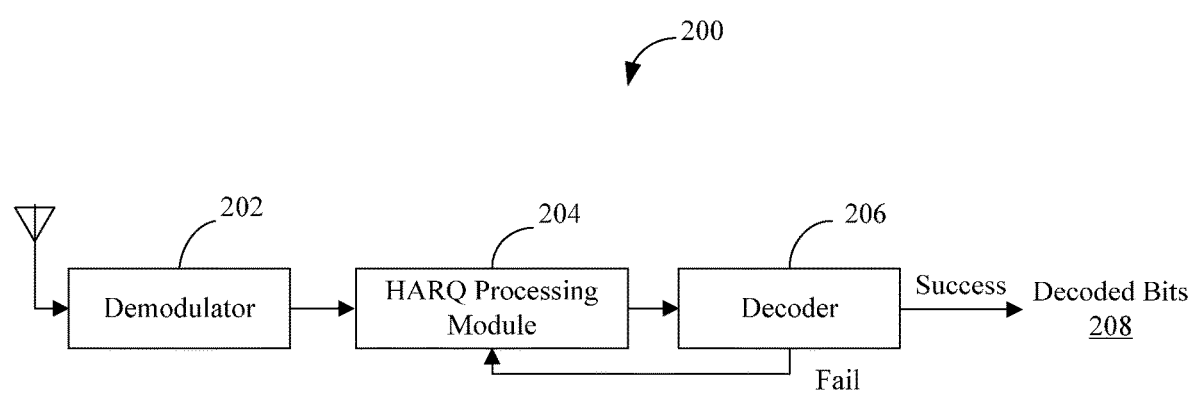
FIG. 2 is a logic flow of one embodiment of a process for processing radio frequency signals received by the apparatus according to FIG. 1.

FIG. 2 illustrates a logical flow 200 of a method for processing RF signals received by the RF unit 130 of the apparatus 100. The logical flow 200 comprises a demodulator 202, a HARQ processing module 204, and a decoder 206. It should be noted that the underlying concept of the present embodiment(s) would not change if one or more blocks (or steps) were added to or removed from the logical flow 200.

In one embodiment, the apparatus 100 uses a HARQ scheme. The logical flow 200 shows a flow for processing RF signals received by the RF unit 130. After receiving RF signals, the RF signals are forwarded to the demodulator 202, where new log likelihood ratio (LLR) values (soft bits) are obtained. After obtaining the new LLR values, the HARQ processing module 204 subsequently retrieves the compressed LLR value(s) from the HARQ buffer, and decompress and/or scales back the compressed LLR value(s). The decoder 206 then decodes LLR values which combine the decompressed LLR values and the new LLR values. If the combined LLR values are decoder-failed, then the combined LLR values are forwarded to the HARQ processing module 204 to be compressed and stored in the HARQ buffer 122, in preparation for a retransmission. If the combined LLR values are decoded successfully, the decoded bits 208 are outputted by the decoder 206.

Figure 3:
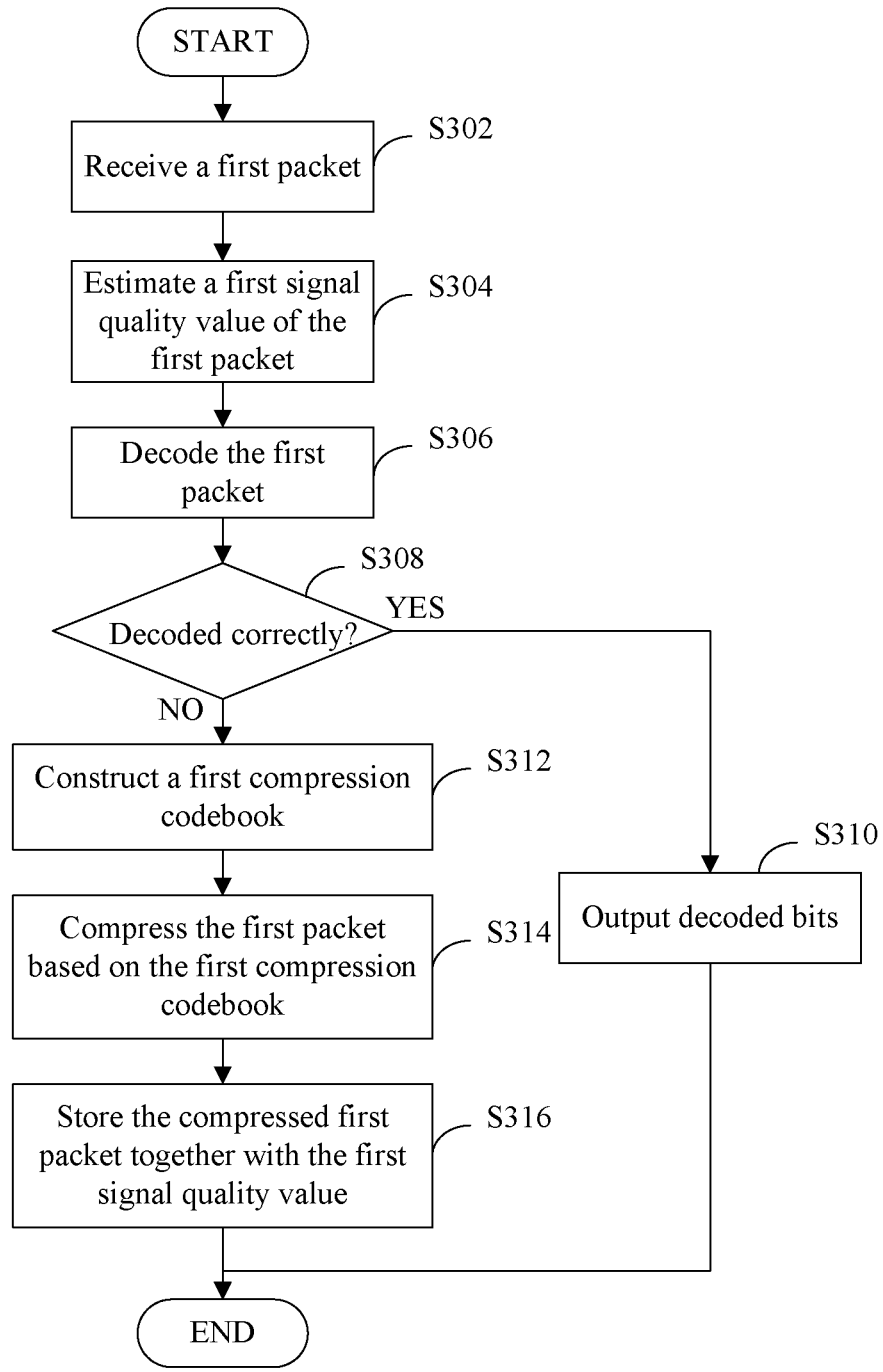
FIG. 3 is a flow chart of one embodiment of a method for reducing amount of memory used by HARQ operations.

FIG. 3 is a flow chart illustrating a method executed by the apparatus 100 for reducing memory space used by HARQ operations.

Step S302, the apparatus 100 receives a first packet. In one embodiment, the received first packet is encoded based on a low-density parity-check (LDPC) code. LDPC code is a linear error correcting code used in 3GPP 5G technology.

Step S304, the apparatus 100 estimates a quality of signal (first signal quality) value of the first packet. In one example, the apparatus 100 estimates the first signal quality value by performing one or more channel measurements. In one embodiment, the first signal quality value comprises signal-to-noise ratio (SNR) value, signal-to-interference plus noise ratio (SINR) value, channel quality indicator (CQI) value, channel state information (CSI) value, or other values representing the signal quality of the first packet.

Step S306, the apparatus 100 decodes the first packet using a LDPC decoding algorithm. In one embodiment, the LDPC decoding algorithm comprises a sum-product algorithm and a min-sum algorithm. In one example, the apparatus 100 identifies a bit sequence based on the received first packet and generates LLR soft values based on the identified bit sequence, and performs the LDPC decoding algorithm on the generated LLR soft values based on a parity check matrix.

Step S308, the apparatus 100 determines whether the first packet is decoded correctly. In one embodiment, if the decoding process at step S306 converges to a valid codeword, the apparatus 100 determines that the first packet is decoded correctly and proceeds to execute step S310. Otherwise, if the decoding process at step S306 does not converge to a valid codeword after the LDPC decoding algorithm is performed, the apparatus 100 determines that the first packet is decoding-failed and proceeds to execute step S312.

Step S310, the apparatus 100 outputs the decoded bits of the first packet.

Step S312, the apparatus 100 constructs a first compression codebook based on a row weight of the parity check matrix, the first signal quality value of the first packet, and a predefined compression function.

In one embodiment, the demodulated soft values of the first packet are linearly quantized, for example, to 8-bit. Under this quantization, $L_8$ comprises one bit for sign bit, two bits for integer part and five bits for decimal fraction. In the embodiment, the apparatus 100 adapts non-linear compression function as the predefined compression function, to compress the first packet to 4 bits. The predefined compression function comprises S-shape function such as sigmoid function, hyperbolic tangent function, and algebraic function.

In one embodiment, to optimize quantization, the input of the predefined compression function is multiplied by Gain as a parameter, so that the statistical distances before compression and the distribution after compression are optimized. In one embodiment, the parameter Gain is determined based on the row weight of the parity check matrix and the first signal quality value of the first packet. The first compression codebook can be constructed by the apparatus 100 based on the Gain parameter, that is, the row weight of the parity check matrix and the first signal quality value of the first packet, and the predefined compression function.

Step 314, the apparatus 100 compresses the first packet based on the first compression codebook.

Step 316, the apparatus 100 stores the compressed first packet and the first signal quality value in the HARQ buffer.

Figure 4:
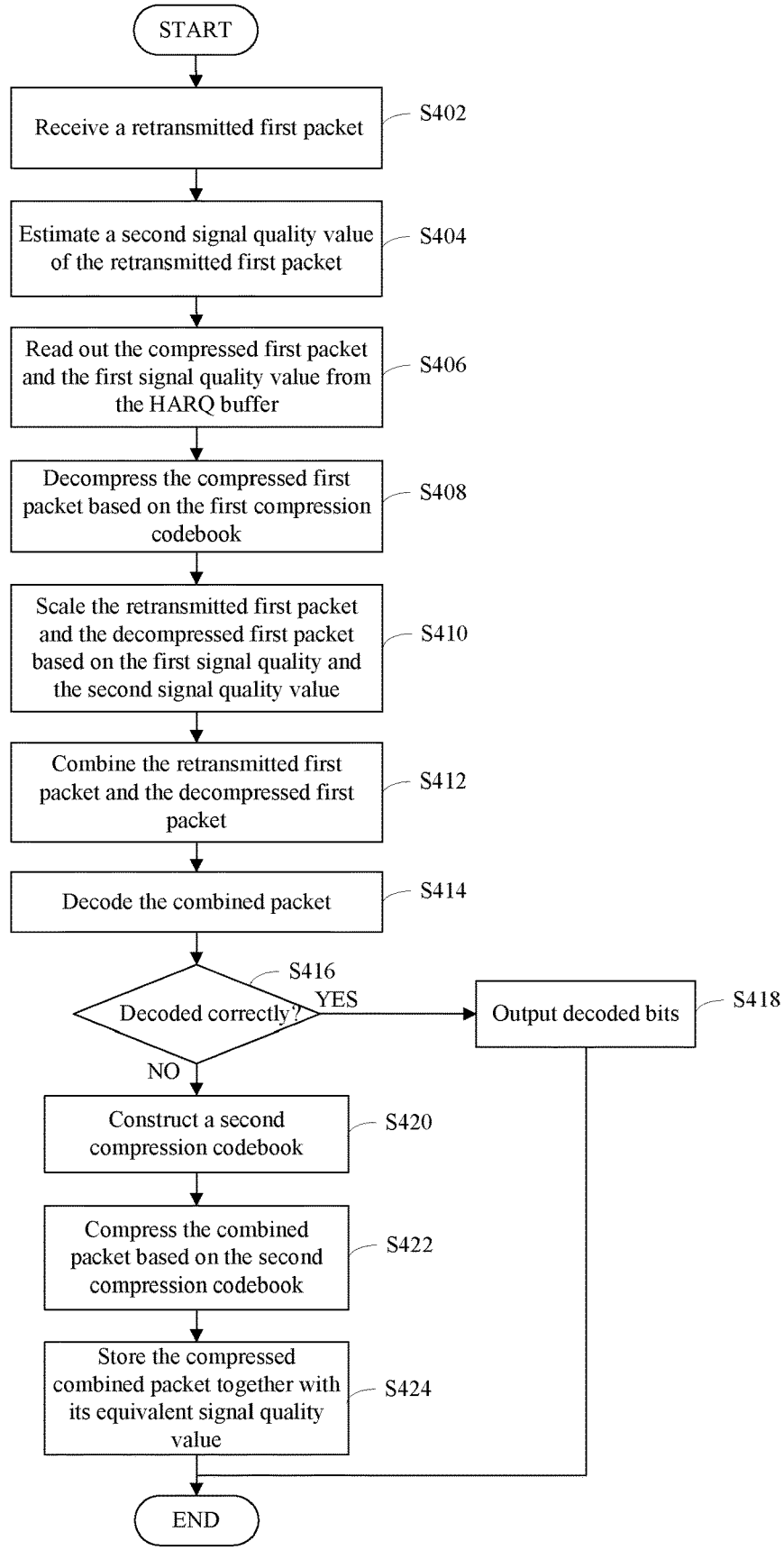
FIG. 4 is a flow chart of another embodiment of a method for reducing amount of memory used by HARQ operations.

FIG. 4 is a flow chart illustrating another method executed by the apparatus 100 for reducing memory space used by HARQ operations.

Step S402, the apparatus 100 receives a first packet which has been retransmitted. In one embodiment, the retransmitted first packet is encoded based on the LDPC code.

Step S404, the apparatus 100 estimates a quality of the signal (second signal quality) value of the retransmitted first packet. In one example, the apparatus 100 estimates the quality of the signal value by performing one or more channel measurements. In one embodiment, the second signal quality value comprises SNR value, SINR value, CQI value, CSI value, or other values representing the signal quality of the retransmitted first packet.

Step S406, the apparatus 100 accesses and reads the compressed first packet and the first signal quality value from the HARQ buffer.

Step S408, the apparatus 100 decompresses the compressed first packet based on the first decompression codebook.

Step S410, the apparatus 100 scales the retransmitted first packet and the decompressed first packet based on the first signal quality value and the second signal quality value.

Step S412, the apparatus 100 combines the retransmitted first packet and the decompressed first packet by performing maximal ratio combining (MRC).

Step S414, the apparatus 100 decodes the combined packet using the LDPC decoding algorithm. In one embodiment, the LDPC decoding algorithm comprises a sum-product algorithm and a min-sum algorithm. In one example, the apparatus 100 identifies a bit sequence based on the combined packet and generates LLR soft values based on the identified bit sequence, and performs the LDPC decoding algorithm on the generated LLR soft values based on a parity check matrix.

Step S416, the apparatus 100 determines whether the combined packet is decoded correctly. In one embodiment, if the decoding process at step S414 converges to a valid codeword, the apparatus 100 determines that the combined packet is decoded correctly and proceeds to execute step S418. Otherwise, if the decoding process at step S414 does not converge to a valid codeword after the LDPC decoding algorithm is performed, the apparatus 100 determines that the combined packet is a decoding-fail and proceeds to execute step S420.

Step S418, the apparatus 100 outputs the decoded bits of the combined packet.

Step S420, the apparatus 100 constructs a second compression codebook based on the row weight of the parity check matrix, a combined signal quality value of the combined packet, and the predefined compression function. In the embodiment, the combined signal quality value of the combined packet equals the sum of the first signal quality value and the second signal quality value. In the embodiment, the predefined compression function comprises S-shape function such as sigmoid function, hyperbolic tangent function, and algebraic function.

Step S422, the apparatus 100 compresses the combined packet based on the second compression codebook.

Step S424, the apparatus 100 stores the compressed combined packet and the combined signal quality value in the HARQ buffer.

The embodiments shown and described above are only examples. Many details are often found in the relevant art and many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method for reducing amount of memory required by hybrid automatic repeat request (HARD) operations, the method comprising:
   receiving, by an apparatus, a first packet which is encoded by a low-density parity-check (LDPC) code;
   estimating, by the apparatus, a first signal quality value of the first packet;
   decoding, by the apparatus, the first packet using a LDPC decoding algorithm;
   determines, by the apparatus, whether the first packet is decoded correctly,
   constructing, by the apparatus, a first compression codebook based on a row weight of a parity check matrix, the first signal quality value, and a predefined compression function if the first packet is not decoded correctly;
   compressing, by the apparatus, the first packet based on the first compression codebook; and
   storing, by the apparatus, the compressed first packet and the first signal quality value in a memory of the apparatus.

2. The method of claim 1, wherein the method further comprises:
   receiving, by the apparatus, a retransmitted first packet which is encoded by a LDPC code;
   estimating, by the apparatus, a second signal quality value of the retransmitted first packet;
   accessing and reading, by the apparatus, the compressed first packet and the first signal quality value from the memory;
   decompressing, by the apparatus, the compressed first packet based on the first compression codebook;
   scaling, by the apparatus, the retransmitted first packet and the decompressed first packet based on the first signal quality value and the second signal quality value;
   combining, by the apparatus, the retransmitted first packet and the decompressed first packet by performing maximal ratio combining; and
   decoding, by the apparatus, the combined packet.

3. The method of claim 2, wherein the method further comprises:
   determining, by the apparatus, whether the combined packet is decoded correctly; and
   outputting, by the apparatus, decoded bits of the combined packet if the combined packet is decoded correctly.

4. The method of claim 3, wherein the method further comprises:
   constructing, by the apparatus, a second compression codebook based on the row weight of the parity check matrix, a combined signal quality value of the combined packet, and the predefined compression function if the combined packet is not decoded correctly;
   compressing, by the apparatus, the combined packet based on the second compression codebook; and
   storing, by the apparatus, the compressed combined packet and the combined signal quality value in the memory.

5. The method of claim 1, wherein the LDPC decoding algorithm comprises: a sum-product algorithm and a min-sum algorithm.

6. The method of claim 1, wherein the first signal quality value comprises: signal-to-noise ratio (SNR) value, signal-to-interference plus noise ratio (SINR) value, channel quality indicator (CQI) value, and channel state information (CSI) value.

7. The method of claim 2, wherein the second signal quality value comprises: SNR value, SINR value, CQI value, and CSI value.

8. The method of claim 1, wherein the predefined compression function comprises S-shape function.

9. An apparatus for reducing amount of memory required by hybrid automatic repeat request (HARD) operation, comprising: a memory storing instructions; and a processor coupled to the memory and, when executing the instructions, configured for:
   receiving a first packet which is encoded by a low-density parity-check (LDPC) code;
   estimating a first signal quality value of the first packet;
   decoding the first packet using a LDPC decoding algorithm;
   determines whether the first packet is decoded correctly,
   constructing a first compression codebook based on a row weight of a parity check matrix, the first signal quality value, and a predefined compression function if the first packet is not decoded correctly;
   compressing the first packet based on the first compression codebook; and
   storing the compressed first packet and the first signal quality value in the memory.

10. The apparatus of claim 9, wherein the processor is further configured for:
    receiving a retransmitted first packet which is encoded by a LDPC code;
    estimating a second signal quality value of the retransmitted first packet;
    accessing and reading the compressed first packet and the first signal quality value from the memory;
    decompressing the compressed first packet based on the first compression codebook;
    scaling the retransmitted first packet and the decompressed first packet based on the first signal quality value and the second signal quality value;
    combining the retransmitted first packet and the decompressed first packet by performing maximal ratio combining; and
    decoding the combined packet.

11. The apparatus of claim 10, wherein the processor is further configured for:
    determining whether the combined packet is decoded correctly; and
    outputting decoded bits of the combined packet if the combined packet is decoded correctly.

12. The apparatus of claim 11, wherein the processor is further configured for:
    constructing a second compression codebook based on the row weight of the parity check matrix, a combined signal quality value of the combined packet, and the predefined compression function if the combined packet is not decoded correctly;
    compressing the combined packet based on the second compression codebook; and
    storing the compressed combined packet and the combined signal quality value in the memory.

13. The apparatus of claim 9, wherein the LDPC decoding algorithm comprises: a sum-product algorithm and a min-sum algorithm.

14. The apparatus of claim 9, wherein the first signal quality value comprises: signal-to-noise ratio (SNR) value, signal-to-interference plus noise ratio (SINR) value, channel quality indicator (CQI) value, and channel state information (CSI) value.

15. The apparatus of claim 10, wherein the second signal quality value comprises: SNR value, SINR value, CQI value, and CSI value.

16. The apparatus of claim 9, wherein the predefined compression function comprises S-shape function.

* * * * *